United States Patent [19]
Hsu et al.

[11] Patent Number: 5,872,042
[45] Date of Patent: Feb. 16, 1999

[54] METHOD FOR ALIGNMENT MARK REGENERATION

[75] Inventors: Shun-Liang Hsu, Mountain-Lake Village; Syun-Ming Jang, Hsin-Chu; Chang-Song Lin, Da-Chi Village, all of Taiwan

[73] Assignee: Taiwan Semiconductor Manufacturing Company, Ltd., Hsin-Chu, Taiwan

[21] Appl. No.: 701,363

[22] Filed: Aug. 22, 1996

[51] Int. Cl.$^6$ .................................................. H01L 21/465
[52] U.S. Cl. ........................... 438/401; 438/637; 438/975
[58] Field of Search ..................................... 438/401, 633, 438/637, 648, 677, 975

[56] References Cited

U.S. PATENT DOCUMENTS

| | | | |
|---|---|---|---|
| 4,992,394 | 2/1991 | Kostelak, Jr. et al. | 437/229 |
| 5,002,902 | 3/1991 | Watanabe | 438/401 |
| 5,017,514 | 5/1991 | Nishimoto | 437/229 |
| 5,157,003 | 10/1992 | Tsuji et al. | 437/229 |
| 5,270,255 | 12/1993 | Wong | 438/643 |
| 5,314,837 | 5/1994 | Barber et al. | 437/89 |
| 5,369,050 | 11/1994 | Kawai | 437/62 |
| 5,401,691 | 3/1995 | Caldwell | 437/228 |
| 5,545,593 | 8/1996 | Watkins et al. | 437/225 |

*Primary Examiner*—John F. Niebling
*Assistant Examiner*—Ha Tran Nguyen
*Attorney, Agent, or Firm*—George O. Saile; Stephen B. Ackerman

[57] ABSTRACT

The contact or via hole etch pattern photomask used in fabrication of integrated circuits is modified to provide a series of grooves or trenches to be etched in the silicon oxide layer simultaneously with the contact or via holes. These trenches, after deposition and planarization of tungsten metal layer, afford regenerated alignment marks with sharply-defined edges even after deposition of a second conductive layer.

5 Claims, 3 Drawing Sheets

METHOD FOR ALIGNMENT MARK REGENERATION

RELATED PATENT APPLICATION

TSMC 95-179, Ser. No. 08/650,699; Filing Date May 20, 1998; Commonly assigned; by C.H. Yu.

BACKGROUND OF THE INVENTION (1) Field of the Invention

The invention relates to a method for regeneration of photolithographic alignment marks under tungsten layers used in the fabrication of semiconductor integrated circuits, and more particularly to a method for regenerating alignment marks which is retained after such tungsten layers have been smoothed by the practice of chemical-mechanical polishing, which tends to eliminate such alignment marks. This practice allows subsequent precision alignment of photomask patterns required for successful circuit fabrication.

(2) Description of the Prior Art

In the fabrication of semiconductor integrated circuits, patterns of the desired configurations of conductors, insulators, and various and sundry other components of the circuit are formed by photolithographic techniques. These techniques employ stencils, known as photomasks, of the patterns which are transferred in a particular order to the circuit under manufacture. A typical integrated circuit may require that as many as a dozen or more such photomasks be employed in its manufacture. It is necessary that the successive photomask pattern applications be accurately aligned to the previous patterns already laid down on the integrated circuit substrate. For the purpose of such alignments of the patterns, a series of alignment marks are provided in each photomask to allow successive photomask patterns to be conveniently and accurately aligned to already-formed circuit patterns present. As successive layers are built up, it may become more difficult to locate and use alignment marks already present in the circuit patterns, due to the presence of intervening thicknesses of layers on the substrate surface. Additionally, the alignment marks present may be affected by subsequent processing of the pattern layer in such a fashion as to be deleterious to their function by rendering them more difficult to be observed clearly and sharply, or by obliterating them altogether. Thus, the alignment capability available for the metallization layer used for via interconnection such as, for example, tungsten relies on the replication of the sharply-defined edges of an alignment mark produced by the etching of a trench in the silicon oxide layer during the etching of contact via holes in the oxide. In this case, the photomask pattern used for the via hole etch pattern also includes the pattern for the oxide alignment mark trench pattern. The deposition of the tungsten follows the etching of the patterns in the oxide. In the conventional processing of integrated circuits, the deposition of tungsten is followed by a chemical-mechanical planarizing of the surface. This process results in a smooth planar surface which eliminates the sharply-defined edges of the alignment marks and renders subsequent pattern alignment difficult if not impossible. In order to restore a means of subsequent alignment of photomask patterns, additional photolithographic steps involving additional photomasking operations, processing, or both would be required. For example, a method of Cyrix involves removing the smoothed tungsten selectively from the alignment mark area by etching back the tungsten chemically. Both an additional photolithographic step and a chemical etch step are required. Another method employed by Advanced Micro Devices involves pre-alignment prior to tungsten metal deposition in a dedicated system with the possibility of generation of particles. Other solutions are covered in various references such as U.S. Pat. No. 5,401,691 to Caldwell, which teaches planarized alignment marks but does not cover chemical-mechanical polishing of metal layers, and in U.S. Pat. No. 5,369,050 (to Kawai), U.S. Pat. No. 4,992,394 (to Kostelak), U.S. Pat. No. 5,157,003 (to Tsuji), and U.S. Pat No. 5,314,837 (to Barber), which all show alignment marks formation, but not by chemical-mechanical polishing. Likewise, the regeneration of previous alignment marks after chemical-mechanical polishing of tungsten layers is not specifically addressed.

SUMMARY OF THE INVENTION

A principal object of the present invention is to provide a method for regeneration of photolithographic alignment marks which are removed by conventional planarization of tungsten metallization layer by chemical-mechanical polishing in the fabrication of semiconductor integrated circuits. A further object of the invention is to describe a photomask pattern modification which regenerates alignment capability during conventional integrated circuit fabrication. In accordance with the objects of the invention, the contact or via hole etch pattern photomask is modified to provide a series of grooves or trenches etched in the silicon oxide layer simultaneously with the contact or via holes. These trenches, after deposition and planarization of tungsten metal layer, afford regenerated alignment marks with sharply-defined edges even after deposition of a second conductive layer.

BRIEF DESCRIPTION OF THE DRAWINGS

In the accompanying drawings forming a material part of this description, there is shown.

DESCRIPTION OF THE PREFERRED EMBODIMENT

Figure 1A:
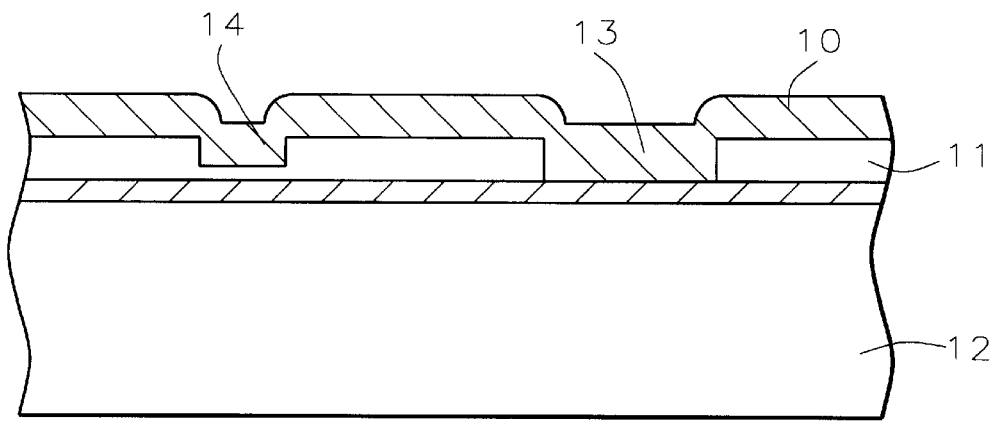
FIG. 1a–b are schematic cross-sectional drawings of a portion of an integrated circuit under fabrication by the prior art.
Figure 1B:
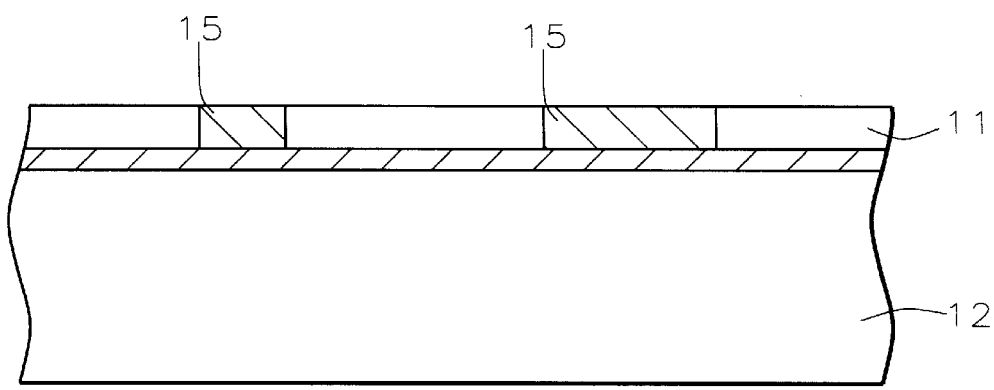

Referring now more particularly to FIG. 1a–b, there are shown two schematic cross-sectional views of a portion of an integrated circuit being fabricated according to the prior art. In FIG. 1a, a blanket layer of tungsten metal 10 has been deposited over a silicon oxide layer 11 on a semiconductor substrate 12. The oxide layer has been etched to provide a via contact hole 13 and an alignment mark 14 whose edges provide a reference point for subsequent alignment of succeeding photomask patterns in the fabrication sequence. Referring to FIG. 1b, there is shown after chemical-mechanical polishing (CMP) of tungsten the resultant planar surface 15 due to removal and destruction of edges or other surface features which were used as a focusing point for alignment of features on the substrate to succeeding photomask patterns.

Figure 2A:
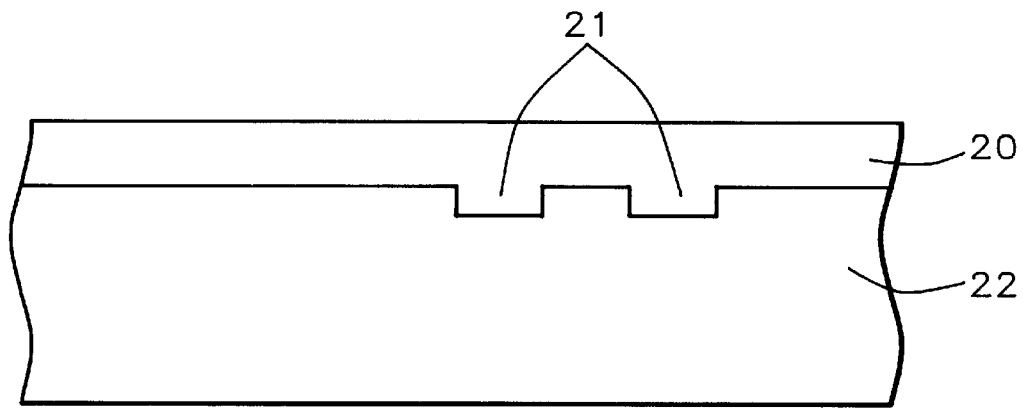
FIG. 2a–d are schematic cross-sectional drawings of a portion of an integrated circuit under fabrication by the present invention.
Figure 2B:
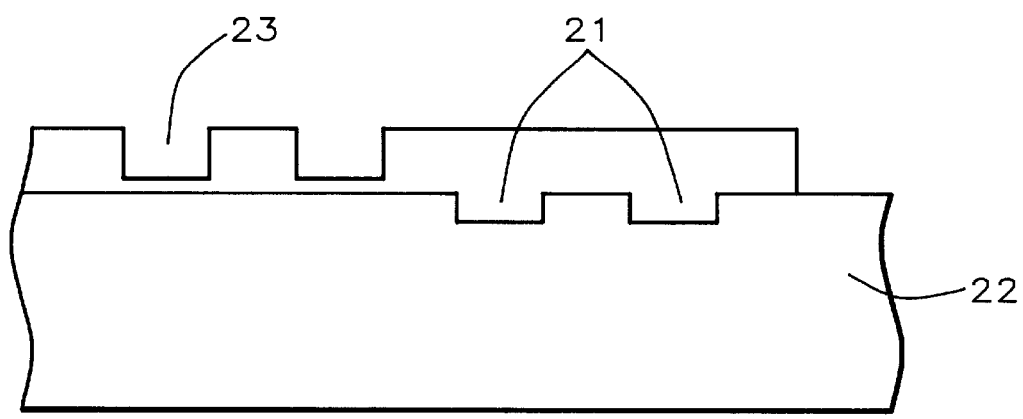
Figure 2C:
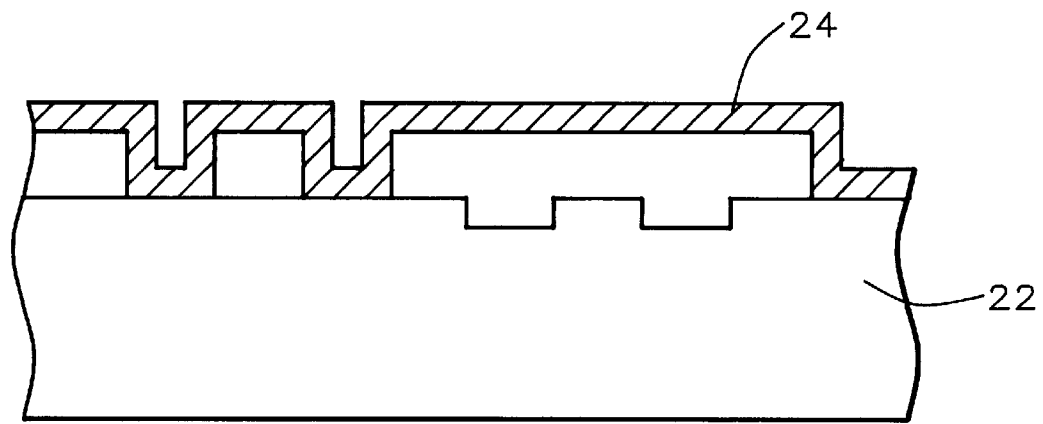
Figure 2D:
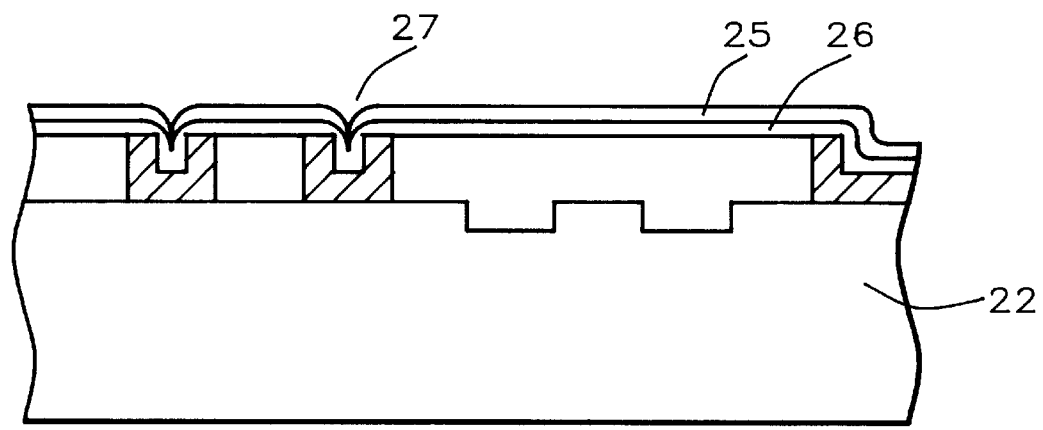

Referring now more particularly to FIG. 2a–d, there is shown the method of the invention in more detail. In FIG. 2a is shown a layer of silicon oxide 20 deposited over a pattern of features on a semiconductor substrate 22 among which are an alignment mark 21. FIG. 2b shows a series of grooves or trenches 23 etched into the oxide layer adjacent to the alignment mark. The photomask pattern normally used to etch contact or via holes in the oxide layer has been modified to contain the groove or trench pattern so that holes and trenches can be fabricated by the same photolithographic processes steps. The grooves or trenches are etched to a depth of between 0.8 to 1.2 microns and to a width of between 7 and 9 microns typically. The grooves or trenches are oriented orthogonally in the x- and y-directions to allow orientation in both directions. In FIG. 2c, a tungsten metal layer has been deposited over the oxide layer 24 to a thickness less than the depth of the trenches. FIG. 2d shows the result of the CMP processing to planarize the surface followed by the deposition of second conductive layers 25 and 26; typically these layers are of metals such as aluminum, copper, and titanium nitride. The The CMP processing has not destroyed or removed the resulting topography of the surface, which topography displays suitable sharply-defined edges 27 for subsequent alignment of photomask patterns and succeeding fabrication steps, even after deposition of a second conductive layer. Typical alignment patterns which take advantage of the sharply-defined edges of the invention utilize both of the orthogonal x- and y-direction features to allow simultaneous global alignment of the next pattern. The addition of pattern features to an already existing photomask pattern outside any critical feature area does not add significantly to the complexity or cost of the circuit manufacturing process, nor does the oxide etch step to define the groove or trench pattern since no additional mask is required. Likewise, the area requirements for the line pattern on the contact or via hole etch mask are insignificant due to the compact orthogonal x- and y-directional layout of the trench or groove pattern.

While the invention has been particularly shown and described with reference to the preferred embodiments thereof, it will be understood by those skilled in the art that various changes in form and details may be made without departing from the spirit and scope of the invention.

What is claimed is:

1. A method in the fabrication of integrated circuits from a semiconductor substrate for restoring photolithographic alignment marks, comprising:

providing a semiconductor substrate having an alignment mark, and an insulating layer on the substrate;

etching contact or via holes and a series of grooves or trenches in the insulating layer, wherein the grooves or trenches are located adjacent to the alignment mark;

depositing a tungsten metallization layer over the insulating layer, wherein the tungsten metallization layer has a thickness less than a depth of the grooves or trenches in the insulating layer; and planarizing the tungsten metallization layer by chemical-mechanical polishing.

2. The method of claim 1 wherein the grooves or trenches are oriented orthogonally in the x- and y-directions.

3. The method of claim 1 wherein the insulating layer is formed of silicon oxide, and the grooves or trenches are formed simultaneously with the via or contact holes.

4. The method of claim 1 wherein the grooves or trenches are between about 0.8 to 1.2 microns in depth and between about 7 to 9 microns wide.

5. The method of claim 1 further comprising depositing a second conductive layer over the tungsten metallization surface, wherein the second conductive layer is selected from the group consisting of aluminum, copper, and titanium nitride.

* * * * *